(12) United States Patent
Takagi

(10) Patent No.: US 10,110,185 B2
(45) Date of Patent: Oct. 23, 2018

(54) MICROWAVE SEMICONDUCTOR DEVICE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/600,094

(22) Filed: May 19, 2017

(65) Prior Publication Data
US 2018/0083582 A1 Mar. 22, 2018

(30) Foreign Application Priority Data

Sep. 16, 2016 (JP) .................................. 2016-182053
Mar. 30, 2017 (JP) .................................. 2017-066958

(51) Int. Cl.
| | | |
|---|---|---|
| *H03F 3/191* | (2006.01) | |
| *H03F 3/60* | (2006.01) | |
| *H03F 3/213* | (2006.01) | |
| *H03F 3/00* | (2006.01) | |
| *H03F 1/32* | (2006.01) | |

(Continued)

(52) U.S. Cl.
CPC ............. *H03F 3/601* (2013.01); *H01L 23/66* (2013.01); *H01L 27/06* (2013.01); *H03F 1/32* (2013.01); *H03F 3/005* (2013.01); *H03F 3/213* (2013.01); *H01L 2223/6627* (2013.01); *H01L 2223/6655* (2013.01)

(58) Field of Classification Search
CPC ............. H03F 1/14; H03F 3/191; H03F 3/193
USPC .................................................. 330/302, 307
See application file for complete search history.

(56) References Cited

U.S. PATENT DOCUMENTS 4,713,634 A * 12/1987 Yamamura ............ H01L 23/047
174/551
6,396,342 B1 5/2002 Takenaka
(Continued)

FOREIGN PATENT DOCUMENTS

| EP | 1 145 314 B1 | 1/2007 |
|---|---|---|
| JP | 6-164266 A | 6/1994 |

(Continued)

*Primary Examiner* — Steven J Mottola
(74) *Attorney, Agent, or Firm* — Oblon, McClelland, Maier & Neustadt, L.L.P.

(57) ABSTRACT

A microwave semiconductor device of an embodiment includes a package, a semiconductor amplifying element, an output matching circuit, and a smoothing circuit. The package includes a metal base plate, a frame body bonded to a surface of the metal base plate, an input feedthrough part, and an output feedthrough part. The semiconductor amplifying element has an output electrode. The output matching circuit includes an output matching capacitor, and a first bonding wire connected to the output matching capacitor and the output electrode. The smoothing circuit includes a smoothing capacitor, and a second bonding wire. The smoothing capacitor is connected by the second bonding wire to a position in the output matching circuit at which capacitive reactance component of a load impedance seen from the output matching capacitor is smaller than inductive reactance component of the load impedance seen from the output electrode of the semiconductor amplifying element.

7 Claims, 6 Drawing Sheets

(51) Int. Cl.
*H01L 27/06* (2006.01)
*H01L 23/66* (2006.01)

(56) References Cited

U.S. PATENT DOCUMENTS

2003/0076659 A1\* 4/2003 Ichitsubo ................ H01L 23/13
                                                                               361/748
2015/0349727 A1 12/2015 Flowers et al.

FOREIGN PATENT DOCUMENTS

| JP | 2001-111364 | 4/2001 |
|----|-------------|--------|
| JP | 5734727 | 6/2015 |

\* cited by examiner in MICROWAVE SEMICONDUCTOR DEVICE

CROSS-REFERENCE TO RELATED APPLICATIONS

This application is based upon and claims the benefit of priority from Japanese Patent Application No. 2016-182053, filed on Sep. 16, 2016 and Japanese Patent Application No. 2017-066958, filed on Mar. 30, 2017; the entire contents of which are incorporated herein by reference.

FIELD

Embodiments described herein relate generally a microwave semiconductor device.

BACKGROUND There is known a digital communication system having a baseband frequency of 100 MHz.

For a baseband frequency near 100 MHz, the application voltage to the output electrode of a high-frequency semiconductor amplifying element can be smoothed by a capacitor disposed near the output terminal of the amplifier.

On the other hand, an internally matched microwave semiconductor amplifier includes a matching circuit between the high-frequency semiconductor amplifying element and the output terminal. However, for a baseband frequency as high as 100 MHz, the applied voltage to the output electrode is difficult to smooth by a capacitor provided near the output terminal of the internally matched microwave semiconductor amplifier.

DETAILED DESCRIPTION

In general, according to one embodiment, a microwave semiconductor device of an embodiment includes a package, a semiconductor amplifying element, an output matching circuit, and a smoothing circuit. The package includes a metal base plate, a frame body bonded to a surface of the metal base plate, an input feedthrough part bonded to the surface of the metal base plate and fitted in the frame body, and an output feedthrough part bonded to the surface of the metal base plate and fitted in the frame body at a position opposite to the input feedthrough part. The semiconductor amplifying element is bonded to a region of the surface of the metal base plate surrounded with the frame body, has an output electrode, and has a rectangular planar shape. The output matching circuit includes an output matching capacitor provided on a region of the surface of the metal base plate between the semiconductor amplifying element and the output feedthrough part and disposed along a long side direction of the semiconductor amplifying element, and a first bonding wire connected to the output matching capacitor and the output electrode. The smoothing circuit includes a smoothing capacitor provided on a region of the surface of the metal base plate adjacent to a short side of the semiconductor amplifying element, and a second bonding wire. The smoothing capacitor is connected by the second bonding wire to a position in the output matching circuit at which capacitive reactance component of a load impedance seen from the output matching capacitor is smaller than inductive reactance component of the load impedance seen from the output electrode of the semiconductor amplifying element.

Embodiments of the invention will now be described with reference to the drawings.

Figure 1A:
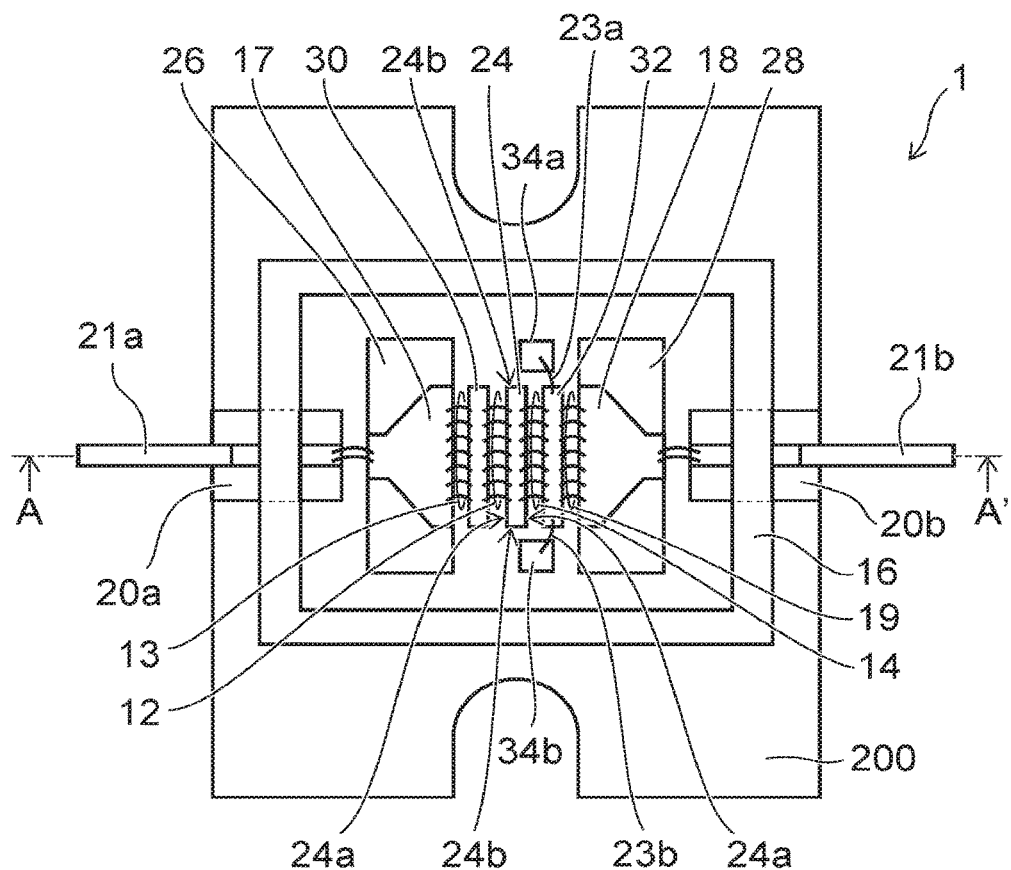
FIG. 1A is a schematic plan view of a microwave semiconductor device according to a first embodiment.
Figure 1B:
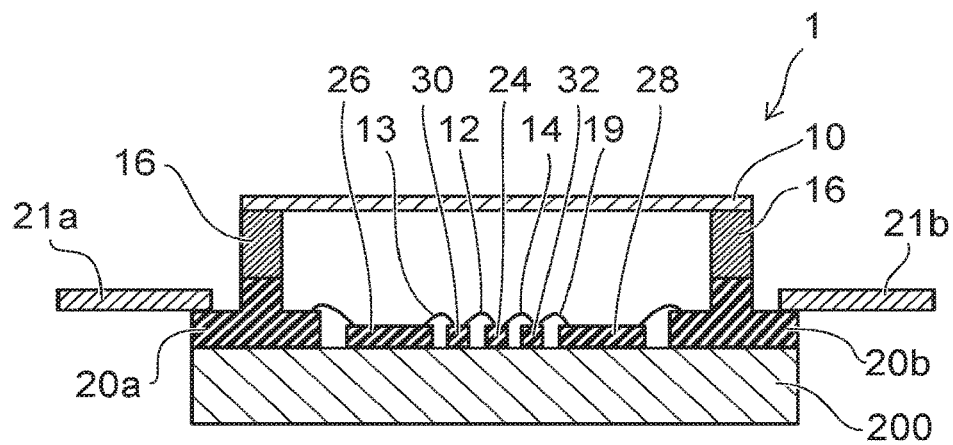
FIG. 1B is a schematic sectional view taken along line A-A'.

FIG. 1A is a schematic plan view of a microwave semiconductor device according to a first embodiment. FIG. 1B is a schematic sectional view taken along line A-A'.

Here, FIG. 1A is a schematic plan view in which the lid part 10 is removed.

Figure 2A:
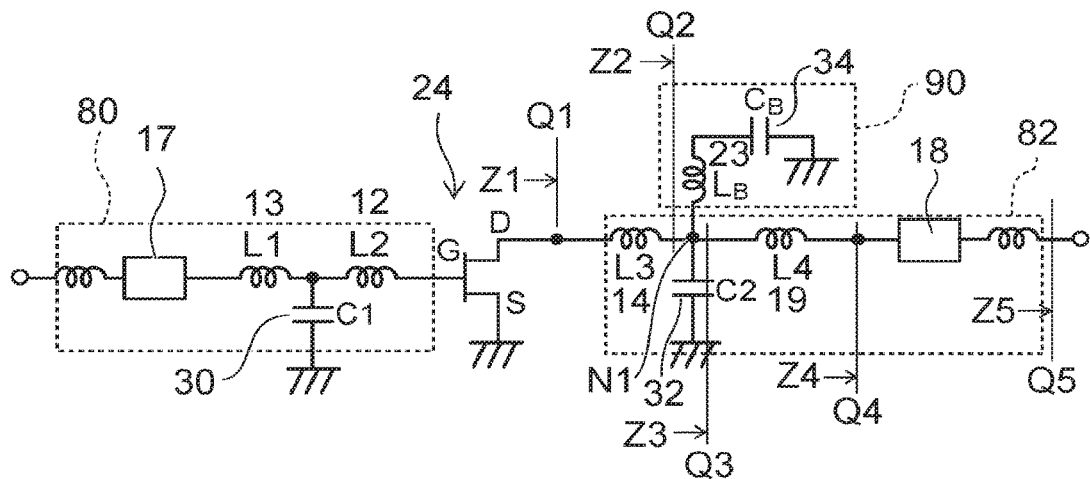
FIG. 2A is an equivalent circuit diagram of the microwave semiconductor device according to the first embodiment.
Figure 2B:
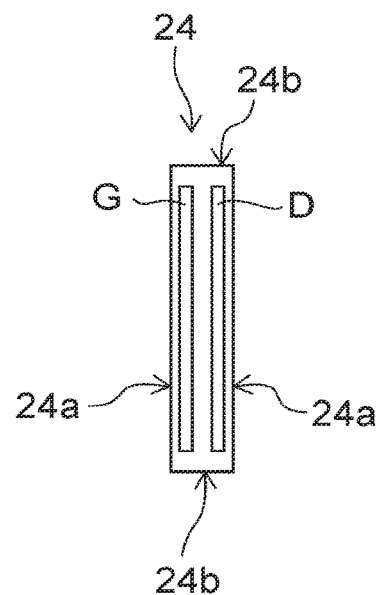
FIG. 2B is a schematic plan view of the semiconductor amplifying element.

FIG. 2A is an equivalent circuit diagram of the microwave semiconductor device according to the first embodiment. FIG. 2B is a schematic plan view of the semiconductor amplifying element.

The microwave semiconductor device 1 includes a package, a semiconductor amplifying element 24, an output matching circuit 82, and a smoothing circuit 90. The output matching circuit 82 includes at least an output matching capacitor 32 and a first bonding wire 14.

The package includes a metal base plate 200, a frame body 16 bonded to a surface of the metal base plate 200 and made of e.g. metal, an input feedthrough part 20a fitted in the frame body 16 and bonded to the surface of the metal base plate 200, and an output feedthrough part 20b fitted in the frame body 16 and bonded to the surface of the metal base plate 200 at a position opposite to the input feedthrough part 20a. The input feedthrough part 20a has an input lead 21a. The output feedthrough part 20b has an output lead 21b. The metal base plate 200 can be made of e.g. Cu, CuW, or CuMo.

The semiconductor amplifying element 24 is bonded to a region of the surface of the metal base plate 200 surrounded with the frame body 16. The semiconductor amplifying element 24 can be e.g. HEMT (high electron mobility transistor) or MESFET (metal semiconductor field effect transistor). As shown in FIG. 2B, the semiconductor amplifying element 24 can include an input electrode G and an output electrode D on the upper surface of the chip. Furthermore, a ground electrode S can be provided on the lower surface of the chip through a via hole provided in the chip. The semiconductor amplifying element 24 has a rectangular planar shape made of long sides 24a and short sides 24b. The semiconductor amplifying element 24 includes a cell region along a long side 24a. The cell region is a minimum unit having an amplification function.

The output matching capacitor (C2) 32 is bonded to a region of the surface of the metal base plate 200 between the output electrode D and the output feedthrough part 20b. The first bonding wire (L3) 14 connects the output electrode D with the output matching capacitor 32. The output matching capacitor 32 is disposed in parallel along a long side 24a of the semiconductor amplifying element 24.

The microwave semiconductor device 1 can further include an input matching capacitor (C1) 30, a bonding wire (L1) 13, and a bonding wire (L2) 12.

Furthermore, the microwave semiconductor device 1 can include an input distributed constant circuit 17 and an output distributed constant circuit 18. The input distributed constant circuit 17 is configured by providing e.g. a microstrip line on a ceramic substrate 26 made of e.g. $Al_2O_3$. The output distributed constant circuit 18 is configured by providing e.g. a microstrip line on a ceramic substrate 28 made of e.g. $Al_2O_3$.

In FIG. 2A, the output matching circuit (impedance transformation circuit) 82 of the microwave semiconductor device 1 includes the first bonding wire 14, the output matching capacitor 32, a bonding wire (L4) 19, and the output distributed constant circuit 18. The input matching circuit (impedance transformation circuit) 80 of the microwave semiconductor device 1 includes the input distributed constant circuit 17, the bonding wire 13, the input matching capacitor 30, and the bonding wire 12. The input matching capacitor 30 and the output matching capacitor 32 may have a structure in which a dielectric layer having a high relative dielectric constant of e.g. 40-280 is sandwiched between upper and lower electrodes. This can downsize each matching circuit.

The smoothing circuit 90 includes a smoothing capacitor and a second bonding wire ($L_B$) 23. The smoothing capacitor 34 (34a, 34b) is bonded to the surface of the metal base plate 200 so as to be adjacent to a short side 24b of the semiconductor amplifying element 24. The second bonding wire 23 (23a, 23b) connects the smoothing circuit 90 with a prescribed position of the output matching circuit 82.

The smoothing capacitor 34 can have a structure in which a dielectric layer having a high relative dielectric constant is sandwiched between upper and lower electrodes. Each smoothing capacitor 34 can be provided on a region adjacent to the semiconductor amplifying element 24.

When the microwave semiconductor device 1 is desired to provide high output, the semiconductor amplifying element 24 preferably has a multi-cell configuration including parallel arrangement of cell regions.

In FIG. 2A, the smoothing circuit 90 is connected to the output matching capacitor 32 at a connection position N1. The capacitance of the smoothing capacitor 34 is denoted by $C_B$, the value of the current amplitude by $I_{PK}$, the permissible ripple voltage value by $\Delta V$, and the value of the baseband frequency by $\Delta f$. The applied voltage at the output electrode of the semiconductor amplifying element 24 resulting from the baseband frequency component can be smoothed by setting $C_B \geq I_{PK} \times (1/2\pi\Delta f)/\Delta V$.

The wire length is set so that at the operating frequency, the inductance component of the second bonding wire 23 (23a, 23b) constituting the smoothing circuit 90 has a sufficiently higher impedance than the load impedance of the matching circuit at the connection position of the smoothing circuit 90. This reduces the operating frequency component leaking to the smoothing capacitor 34. That is, the smoothing circuit 90 is provided so as not to affect the operating frequency signal.

On the other hand, if the second bonding wire 23 (23a, 23b) is made too long so that the impedance is high even at the baseband frequency, then the effect of the smoothing capacitor is weakened. This hampers smoothing of the applied voltage at the output electrode of the semiconductor amplifying element 24.

Figure 3:
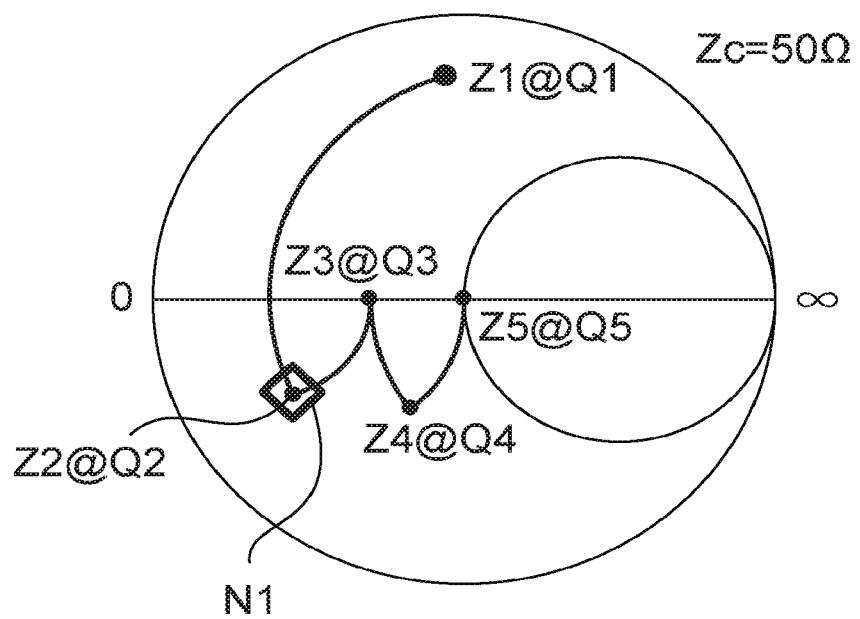
FIG. 3 is a Smith chart describing the load impedance transformation of the microwave semiconductor device according to the first embodiment.

FIG. 3 is a Smith chart describing the load impedance transformation of the microwave semiconductor device according to the first embodiment.

This figure shows the normalized impedance for a characteristic impedance ($Z_C$) of 50Ω. The resistance component of the semiconductor amplifying element 24 is near e.g. 2.5Ω, and has an output capacitance in parallel therewith.

Thus, the output impedance of the semiconductor amplifying element 24 is capacitive. Accordingly, the load impedance Z1 to be matched thereto is inductive.

The magnitude of the operating frequency component leaking to the smoothing capacitor 34 is determined in accordance with a ratio of the load impedance of the matching circuit at the connection position of the smoothing circuit 90 to the impedance at the operating frequency of the smoothing circuit 90. The load impedance Z2 as viewed from the second reference plane Q2 before addition of the inductive reactance due to the first bonding wire 14 is capacitive.

The capacitive reactance component of the load impedance Z2 is smaller than the inductive reactance component of the load impedance Z1. Thus, the load impedance Z2 of the output matching circuit 82 at the connection position N1 of the output matching circuit 82 is smaller than the load impedance Z1 at the output electrode D of the semiconductor amplifying element 24. This can maintain a large impedance ratio at the operating frequency of the smoothing circuit 90 versus the load impedance at the operating frequency of the output matching circuit at the connection position of the smoothing circuit 90 even if the second bonding wire 23a, 23b of the smoothing circuit 90 is made shorter. As a result, the impedance at the baseband frequency of the second bonding wire 23a, 23b of the smoothing circuit 90 can be lowered while sufficiently reducing the operating frequency component leaking to the smoothing capacitor 34. This enhances the effect of the smoothing capacitor 34 at the baseband frequency.

Figure 4A:
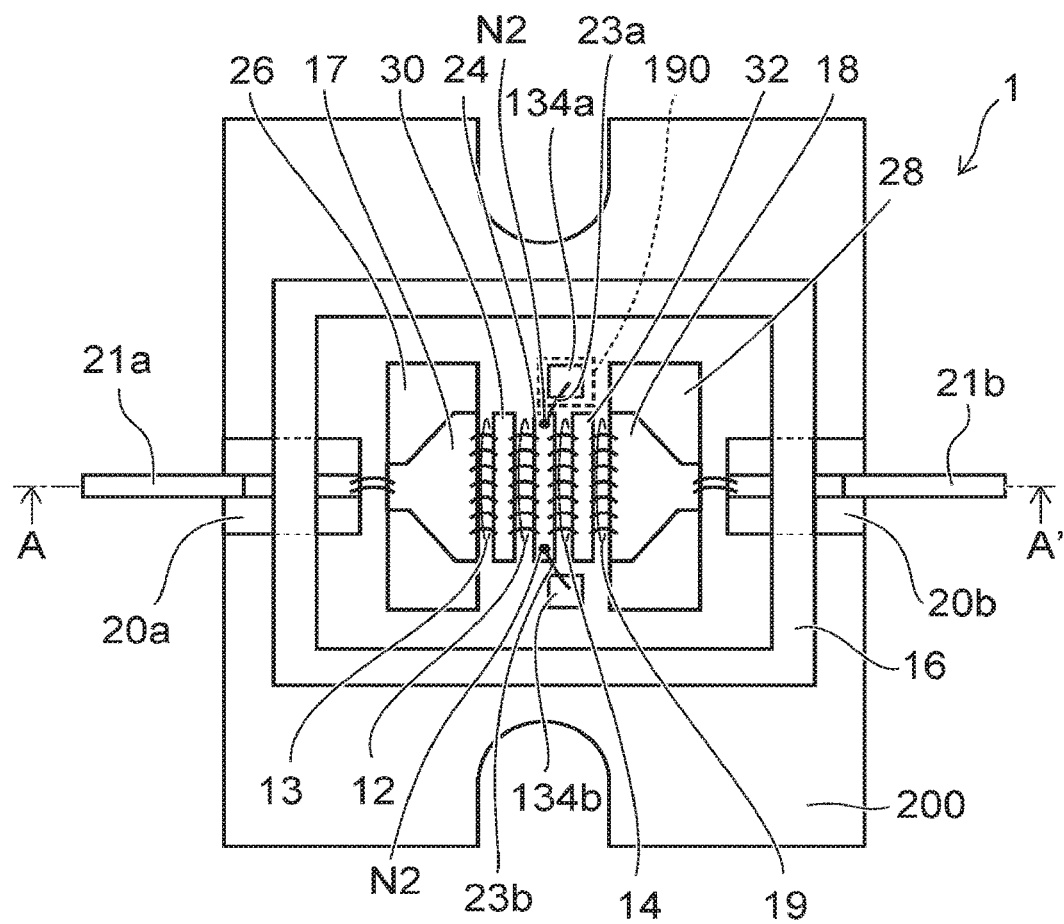
FIG. 4A is a schematic plan view of a microwave semiconductor device according to a comparative example.
Figure 4B:
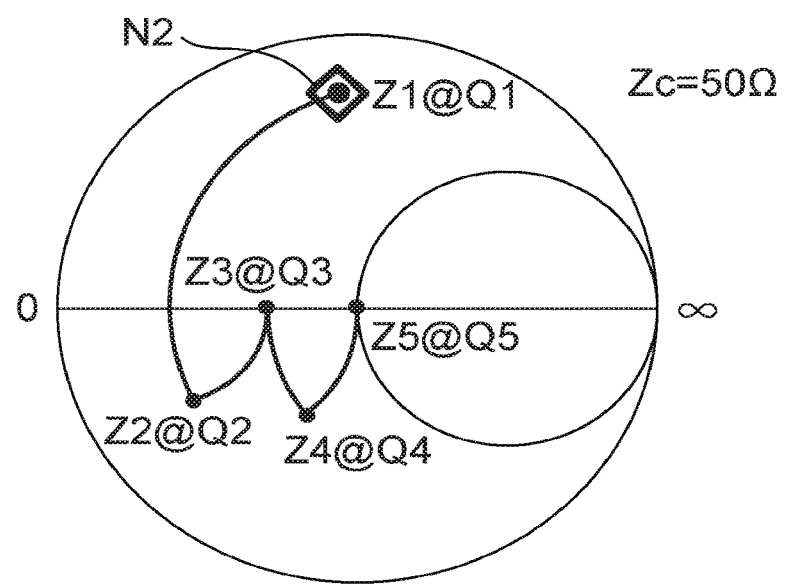
FIG. 4B is a Smith chart describing its load impedance transformation.

FIG. 4A is a schematic plan view of a microwave semiconductor device according to a comparative example. FIG. 4B is a Smith chart describing its load impedance conversion.

This figure shows the normalized impedance for a characteristic impedance $Z_C$ of 50Ω. In the comparative example, the bonding wire 23a of the smoothing circuit 190 is connected to the output electrode (not shown) of the semiconductor amplifying element 24. That is, the inductive reactance of the load impedance Z1 as viewed from the connection position N2 is larger than the capacitive reactance of the load impedance Z2 as viewed from the second reference plane Q2 by the amount of addition of the inductive reactance due to the first bonding wire 14.

The load impedance Z1 at the operating frequency of the connection position N2 is higher than the load impedance Z2. By this amount, the second bonding wire 23a of the smoothing circuit 190 needs to be lengthened to increase the impedance of the smoothing circuit 190 at the operating frequency. Thus, the operating frequency component leaking to the smoothing capacitor 134a, 134b needs to be reduced. Lengthening the second bonding wire 23a results in increasing the impedance at the baseband frequency of the second bonding wire 23a of the smoothing circuit 190. This lowers the effect of the smoothing capacitor 134 at the baseband frequency.

Figure 5:
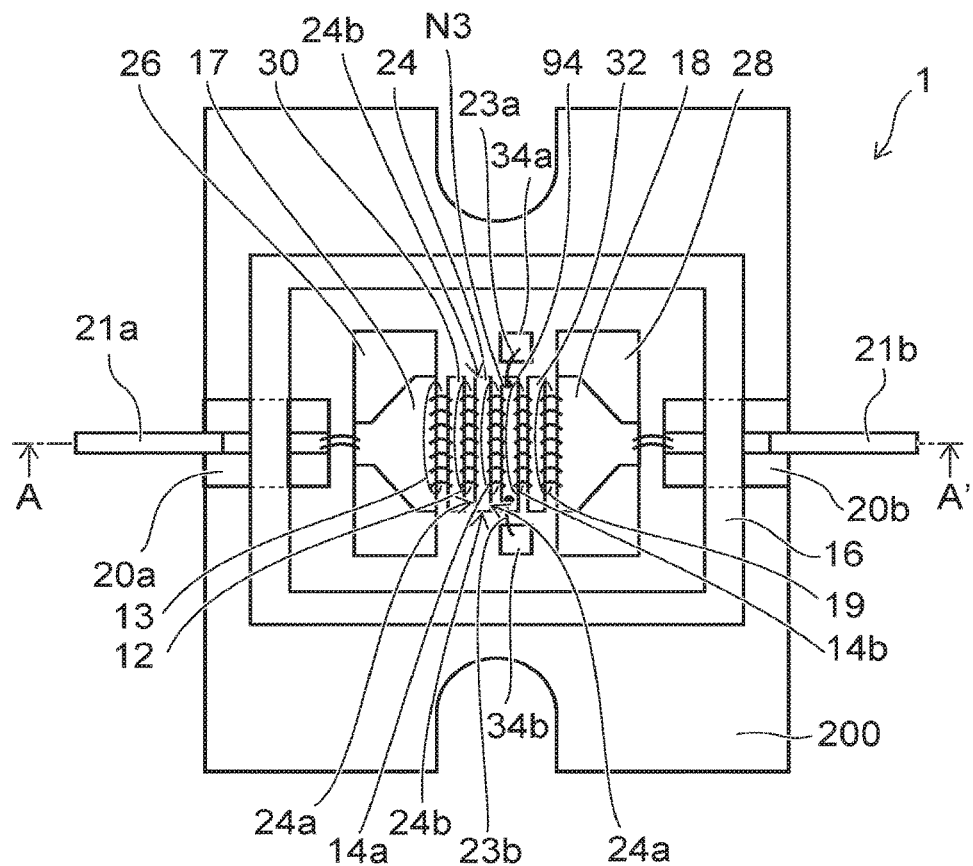
FIG. 5 is a schematic plan view of a microwave semiconductor device according to a second embodiment.

FIG. 5 is a schematic plan view of a microwave semiconductor device according to a second embodiment.

Figure 6:
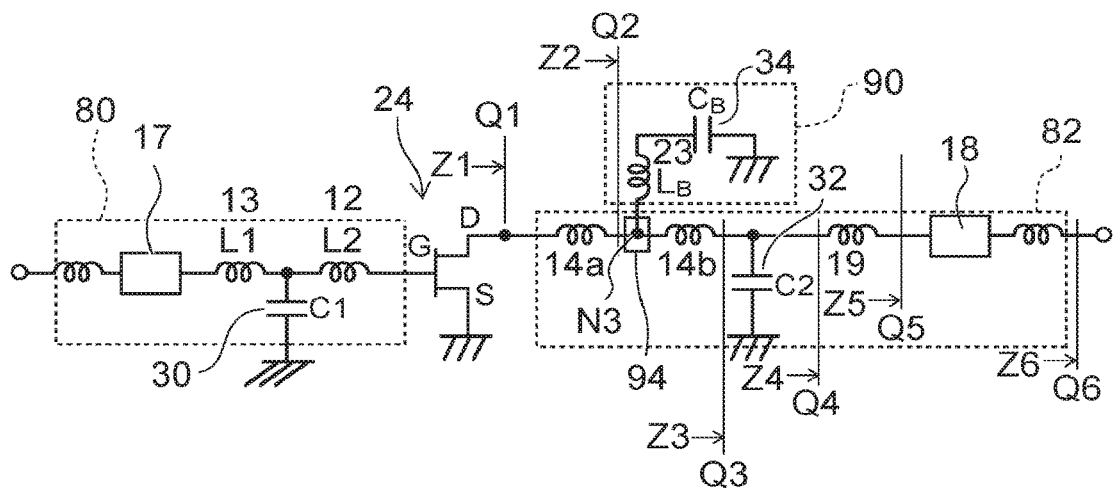
FIG. 6 is an equivalent circuit diagram of the microwave semiconductor device according to the second embodiment.

FIG. 6 is an equivalent circuit diagram of the microwave semiconductor device according to the second embodiment.

Figure 7:
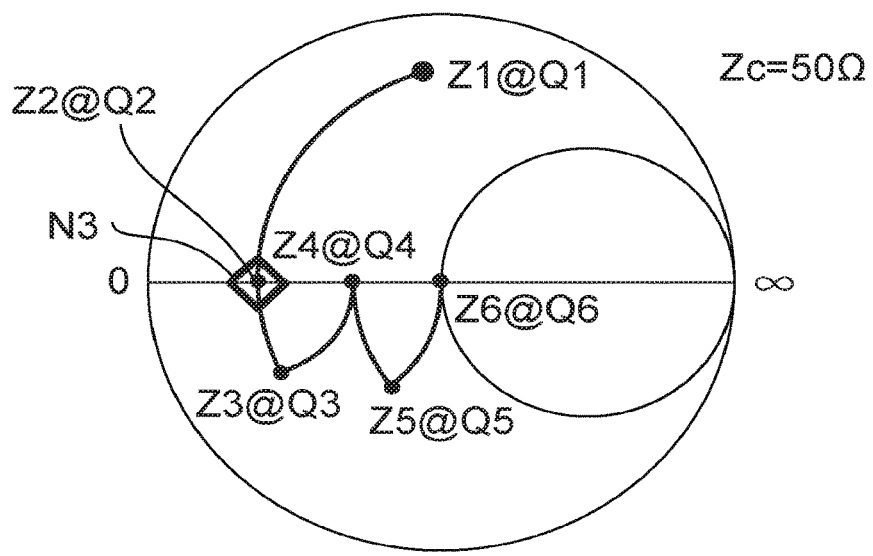
FIG. 7 is a Smith chart describing the load impedance of the microwave semiconductor device according to the second embodiment.

FIG. 7 is a Smith chart describing the load impedance of the microwave semiconductor device according to the second embodiment.

The lowest impedance point in the impedance transformation circuit occurs when the output capacitance component of the semiconductor amplifying element 24 is canceled by part of the inductance of the first bonding wire 14 of the output matching circuit 82. This is a point on the real axis in the Smith chart. The connection position N3 of the smoothing circuit 90 and the output matching circuit 82 is placed at the lowest impedance point in the impedance transformation circuit. This can minimize the length of the second bonding wire 23 (23a, 23b) of the smoothing circuit 90 and maximize the effect of the smoothing capacitor 34 (34a, 34b). In FIG. 5, a relay substrate 94 including a bonding electrode (not shown) is further provided between the semiconductor amplifying element 24 and the output matching capacitor 32. The relay substrate 94 is disposed along a long side 24a of the semiconductor amplifying element 24. The first bonding wire 14 is divided into two by the relay substrate 94. This can make a connection position N3.

The output electrode D of the semiconductor amplifying element 24 and the bonding electrode of the relay substrate 94 are connected by a first portion 14a of the first bonding wire 14.

The bonding electrode of the relay substrate 94 and the output matching capacitor 32 are connected by a second portion 14b of the first bonding wire 14. The first portion 14a of the first bonding wire 14 and the second portion 14b of the first bonding wire 14 may be continuous. For instance, use of an automatic wire bonder facilitates continuation of the first portion 14a and the second portion 14b. The second bonding wire 23 (23a, 23b) is connected to the bonding electrode of the relay substrate 94.

In this case, in FIG. 7, the connection position N3 is determined to lie near the point Z2@Q2 where the load impedance of the impedance transformation circuit crosses the real axis of the Smith chart (pure resistance containing only the resistance component without containing any reactance component). That is, the first portion 14a of the first bonding wire 14 and the second portion 14b of the first bonding wire 14 are provided so that the first bonding wire 14 has an inductance component resonating at the operating frequency with the output capacitance component of the semiconductor amplifying element 24. Then, the connection position N3 of the smoothing circuit 90 and the output matching circuit 82 can be placed at the lowest impedance point in the impedance transformation circuit. This can maximize the effect of the smoothing capacitor 34 (34a, 34b). The relay substrate 94 does not need to constitute the capacitor. Thus, the relative dielectric constant of the relay substrate is preferably lower.

Figure 8:
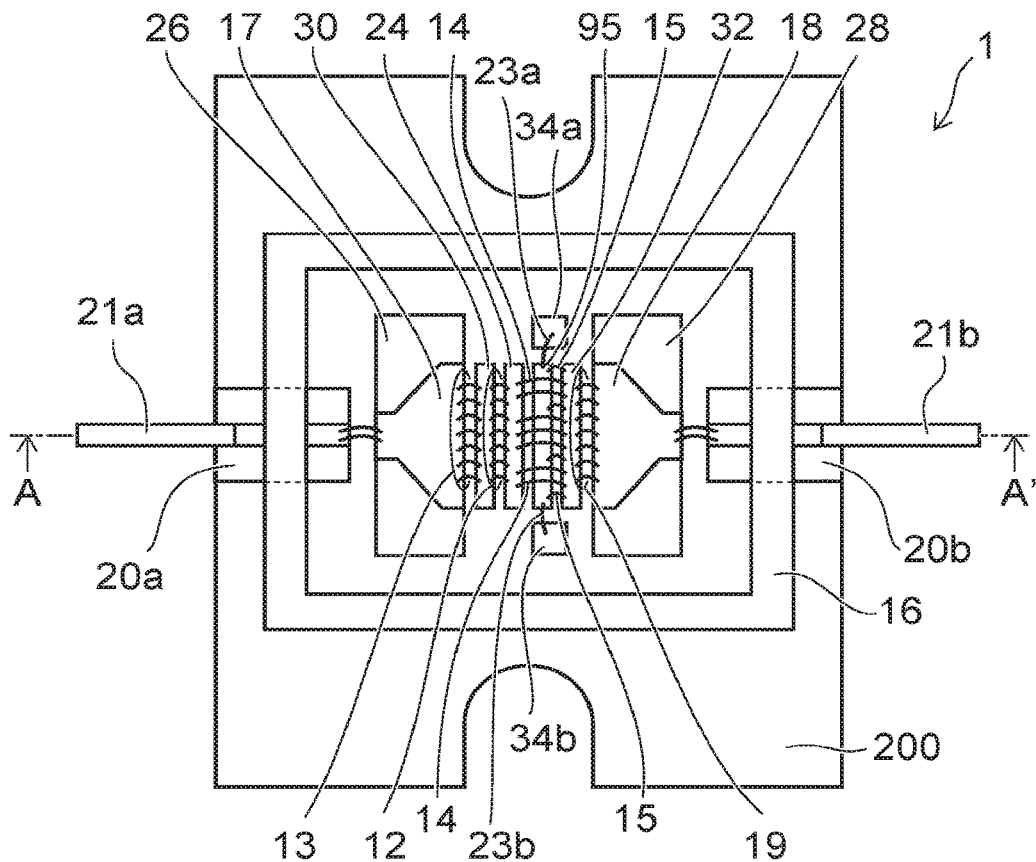
FIG. 8 is a schematic plan view of a microwave semiconductor device according to a variation of the second embodiment.

FIG. 8 is a schematic plan view of a microwave semiconductor device according to a variation of the second embodiment.

In this variation, an auxiliary substrate 95 (acting as an auxiliary smoothing capacitor) including a bonding electrode is further provided between the semiconductor amplifying element 24 and the output matching capacitor 32. Furthermore, a third bonding wire 15 is further provided to connect the output matching capacitor 32 and the bonding electrode of the auxiliary smoothing capacitor 95. Thus, the smoothing circuit is connected through the auxiliary smoothing capacitor 95. This can uniformly spread the effect of the smoothing capacitor over a plurality of parallel-connected cells. The connection position of the third bonding wire 15 is placed at the connection position N1 where the load impedance at the operating frequency is smaller than that at the connection position N2. Thus, the impedance at the baseband frequency of the second bonding wire 23a of the smoothing circuit can be decreased by shortening the bonding wire 23a of the smoothing circuit. This enhances the effect of the smoothing capacitor 34a at the baseband frequency. Furthermore, the smoothing circuit is uniformly connected to a plurality of parallel-connected cells. Therefore, applied voltages of the cells can be uniform and smoothed.

The first and second embodiments and the variations associated therewith provide a microwave semiconductor device in which the application voltage to the high-frequency semiconductor amplifying element can be smoothed even if the differential frequency is as high as several hundred MHz. This microwave semiconductor device can be used in communication systems such as SNG (satellite news gathering) and MIMO (multiple input multiple output) based on two or more microwave signals having close frequencies.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A microwave semiconductor device comprising:
a package including a metal base plate, a frame body bonded to a surface of the metal base plate, an input feedthrough part bonded to the surface of the metal base plate and fitted in the frame body, and an output feedthrough part bonded to the surface of the metal base plate and fitted in the frame body at a position opposite to the input feedthrough part;
a semiconductor amplifying element bonded to a region of the surface of the metal base plate surrounded with the frame body, having an output electrode, and having a rectangular planar shape;
an output matching circuit including an output matching capacitor provided on a region of the surface of the metal base plate between the semiconductor amplifying element and the output feedthrough part and disposed along a long side direction of the semiconductor amplifying element, and a first bonding wire connected to an upper electrode of the output matching capacitor and the output electrode; and
a smoothing circuit including a smoothing capacitor provided on a region of the surface of the metal base plate adjacent to a short side of the semiconductor amplifying element, and a second bonding wire,
one end of the second boding wire being connected to an upper electrode of the smoothing capacitor, and
another end of the second bonding wire being connected to the upper electrode of the output matching capacitor so that capacitive reactance component of a load impedance seen from a connection position of the output matching capacitor and the first bonding wire is smaller than inductive reactance component of the load impedance seen from the output electrode of the semiconductor amplifying element.

2. A microwave semiconductor device comprising:
a package including a metal base plate, a frame body bonded to a surface of the metal base plate, an input feedthrough part bonded to the surface of the metal base plate and fitted in the frame body, and an output feedthrough part bonded to the surface of the metal base plate and fitted in the frame body at a position opposite to the input feedthrough part;
a semiconductor amplifying element bonded to a region of the surface of the metal base plate surrounded with the frame body, having an output electrode, and having a rectangular planar shape;
an output matching circuit including an output matching capacitor provided on a region of the surface of the metal base plate between the semiconductor amplifying element and the output feedthrough part and disposed along a long side direction of the semiconductor amplifying element, and a first bonding wire connected to the output matching capacitor and the output electrode; and
a smoothing circuit including a smoothing capacitor provided on a region of the surface of the metal base plate adjacent to a short side of the semiconductor amplifying element, and a second bonding wire, wherein
the smoothing capacitor is connected by the second bonding wire to a position in the output matching circuit at which capacitive reactance component of a load impedance seen from the output matching capacitor is smaller than inductive reactance component of the load impedance seen from the output electrode of the semiconductor amplifying element,
the output matching circuit further includes a relay substrate provided on a region of the surface of the metal base plate between the semiconductor amplifying element and the output matching capacitor along the long side direction of the semiconductor amplifying element and having a bonding electrode on a surface thereof,
the first bonding wire includes a first portion connecting the output electrode with the bonding electrode and a second portion connecting the bonding electrode with the output matching capacitor, and
the smoothing capacitor is connected to the bonding electrode by the second bonding wire.

3. The device according to claim 2, wherein the first portion of the first bonding wire has an inductance component resonating at an operating frequency with an output capacitance component of the semiconductor amplifying element.

4. The device according to claim 2, wherein the load impedance seen from the bonding electrode is pure resistance.

5. The device according to claim 3, wherein the load impedance seen from the bonding electrode is pure resistance.

6. A microwave semiconductor device comprising:
a package including a metal base plate, a frame body bonded to a surface of the metal base plate, an input feedthrough part bonded to the surface of the metal base plate and fitted in the frame body, and an output feedthrough part bonded to the surface of the metal base plate and fitted in the frame body at a position opposite to the input feedthrough part;
a semiconductor amplifying element bonded to a region of the surface of the metal base plate surrounded with the frame body, having an output electrode, and having a rectangular planar shape;
an output matching circuit including an output matching capacitor provided on a region of the surface of the metal base plate between the semiconductor amplifying element and the output feedthrough part and disposed along a long side direction of the semiconductor amplifying element, and a first bonding wire connected to the output matching capacitor and the output electrode, and
a smoothing circuit including a smoothing capacitor provided on a region of the surface of the metal base plate adjacent to a short side of the semiconductor amplifying element, and a second bonding wire, wherein
the smoothing capacitor is connected by the second bonding wire to a position in the output matching circuit at which capacitive reactance component of a load impedance seen from the output matching capacitor is smaller than inductive reactance component of the load impedance seen from the output electrode of the semiconductor amplifying element,
the smoothing circuit further includes an auxiliary substrate provided on a region of the surface of the metal base plate between the output electrode and the output matching capacitor along the long side of the semiconductor amplifying element and having a bonding electrode on a surface thereof, and a third bonding wire connecting the output matching capacitor with the bonding electrode of the auxiliary substrate, and
the smoothing capacitor is connected to the bonding electrode of the auxiliary substrate by the second bonding wire.

7. The device according to claim 1, wherein the output matching circuit further includes an output distributed constant circuit provided between the output matching capacitor and the output feedthrough part.

* * * * *